United States Patent [19]
Narita

[11] Patent Number: 5,689,120
[45] Date of Patent: Nov. 18, 1997

[54] MOS FIELD EFFECT TRANSISTOR IN A DYNAMIC RANDOM ACCESS MEMORY DEVICE AND METHOD FOR FABRICATING THE SAME

[75] Inventor: Kaoru Narita, Tokyo, Japan

[73] Assignee: NEC Corporation, Tokyo, Japan

[21] Appl. No.: 730,273

[22] Filed: Oct. 15, 1996

[30] Foreign Application Priority Data

Oct. 14, 1995 [JP] Japan .................................. 7-292086

[51] Int. Cl.$^6$ .................................................. H01L 29/76
[52] U.S. Cl. .............................. 257/67; 257/71; 257/303;
257/329; 257/330; 257/385; 257/618
[58] Field of Search ............................... 257/67, 71, 303,
257/329, 330, 385, 618

[56] References Cited

U.S. PATENT DOCUMENTS 5,181,088 1/1993 Makita et al. ......................... 257/334

*Primary Examiner*—Edward Wojciechowicz
*Attorney, Agent, or Firm*—Young & Thompson

[57] ABSTRACT

The present invention provides a field effect transistor comprising the following elements. An insulation film is provided on a semiconductor substrate. The insulation film has an opening positioned on a predetermined region of the semiconductor substrate. A first polysilicon film is provided over the insulation film. A second polysilicon film is provided in contact with the first polysilicon film. The second polysilicon film extends on inside walls of the opening of the insulation film and over a peripheral portion of the predetermined region of the semiconductor substrate so that the first polysilicon film is connected through the second polysilicon film to the peripheral portion in the predetermined region of the semiconductor substrate. A gate insulation film is selectively provided, which extends on the predetermined region, except on the peripheral portion, of the semiconductor substrate and further extends on the second polysilicon film and a part of the first polysilicon film around the second polysilicon film. A gate electrode is provided on the gate insulation film to define a composite channel region raider the gate insulation film so that the composite channel region extends through the first and second polysilicon films under the gate insulation film as well as through the semiconductor substrate under the gate insulation film. Source and drain regions are selectively provided in the first polysilicon film except under the gate insulation film so that the source and drain regions are connected through the composite channel region.

2 Claims, 5 Drawing Sheets

MOS FIELD EFFECT TRANSISTOR IN A DYNAMIC RANDOM ACCESS MEMORY DEVICE AND METHOD FOR FABRICATING THE SAME

BACKGROUND OF THE INVENTION

The present invention relates to a semiconductor memory device, and more particularly to a dynamic random access memory device including a plurality of memory cells, each of which comprises a cell MOS field effect transistor and a capacitor for improvement in error-free information storage property.

Typical one of conventional dynamic random access memory devices will be described with reference to FIGS. 1A and 1B. FIG. 1A is a fragmentary plane view illustrative of the conventional dynamic random access memory device. FIG. 1B is a fragmentary cross sectional elevation view illustrative of the conventional dynamic random access memory device, taken along a B—B line in FIG. 1A.

As well illustrated in FIGS. 1A and 1B, the conventional dynamic random access memory device is formed on a p-type semiconductor substrate 1. Field oxide films are selectively formed on the p-type semiconductor substrate 1 to define a memory cell region on which a memory cell is formed, which comprises a MOS field effect transistor and a storage capacitor. A gate oxide film 4 is formed on a surface of the p-type semiconductor substrate 1. A plurality of word lines are provided in parallel to each other wherein the word lines extend over the memory cell areas and the field oxide films 2. The word lines positioned over the memory cell areas serve as gate electrodes 3. n+-type source/drain regions 1S and 1D are selectively formed in upper regions of the p-type semiconductor substrate 1 in an alignment technique using the gate electrode 3 and the field oxide film 2 as masks. An inter-layer insulator 5 is entirely formed over the gate oxide film 4, the field oxide film 2 and the gate electrode 3. A contact hole 9 is formed in the inter-layer insulator 5 and is positioned over the n+-type drain region 1D. A storage electrode 6 is selectively formed, which extends within the contact hole 9 and over the inter-layer insulator 5 around the contact hole 9 so that the storage electrode 6 is made into contact with the n+-type drain region 1D. A capacitive dielectric film 7 is selectively provided on a top surface and side walls of the storage electrode 6. A capacitive electrode 8 is entirely formed over the capacitive dielectric film 7 and over the inter-layer insulator 5. Contact holes 15 are formed over the field oxide films 2. Digit lines 14 are provided in parallel to each other but in vertical to the word lines 3. The digit lines 14 are connected through the contact holes 15 to the n+-type source region 1S. The storage capacitor comprises the storage electrode 6, the capacitive dielectric film 7 and the capacitive electrode 8.

Digital signals are transmitted on the digit lines 14 which are connected to the n+-type source region 1S and the digit signals are then transmitted to the n+-type source region 1S. If the gate electrode 3 receives a high level signal, then the MOS field effect transistor is in ON state. As a result, the digit signals are transmitted from the n+-type source region 1S to the n+-type drain region 1D which is connected through the contact hole 9 to the storage electrode 6. The digit signals are then transmitted to the storage electrode 6 thereby the writing operation is completed. Thereafter, a low level signal is applied to the gate electrode 3 to turn the MOS field effect transistor OFF to store information biased upon the digital signal in the capacitor. A storage time of storing the digital data is defined by the property of the storage capacitor. As a result, it is required to carry out frequent writing operations every 100 ms to keep the data.

The cause of such short storage time of the data is leakage of charges stored in the storage electrode 6 through the n+-type drain region 1D to the n-type source region or to the semiconductor substrate 1 as well as another leakage of the charges through the capacitive dielectric film 7 to the capacitive electrode 8. The cause of the above leakage is the fact that if the high level digit signal is stored in the storage electrode 6, then a p-n junction between the p-type semiconductor substrate 1 and the drain region 1D is applied with a reverse bias which forms a space charge region. If the space charge region extends to crystal defects which may be formed, for example, by stress applied when the field oxide films 2 were formed or if the space charge region extends to the interface states. Further, if the capacitive dielectric film 7 has a thin portion, a tunneling current may flow through the thin portion of the capacitive dielectric film 7 into the capacitive electrode 8.

As described above, the storage time of data is defined by the leakage current and the amount of the charge stored. This means that a large capacity of the storage capacitor allows the storage capacitor to possess a long storage time of data. In order to ensure a large capacity of the storage capacitor, a large area of the capacitive dielectric film 7 is necessary.

On the other hand, the requirements for scaling down of the dynamic random access memory device have been on the increase. This means that the scaling down of the memory cell is also required. This means that reduction in area of the storage capacitor is also required. When it is considered that the reduction in area of the storage capacitor is also required, there is a certain limitation to increase in the storage time of data in the storage capacitor. Further, the scaling down of the memory cell causes increase in internal electric field. The increased electric field may cause increase in possibility of a leakage. As a result, the scaling down may result in shortening the storage time of data.

In order to settle the above issues, there was proposed other memory cell structure designed for reducing a possibility of leakage so as to keep a sufficient long storage time of data in the memory cell to make long the period of frequent rewrite operations of data. The other memory cell structure provided in the random access memory device will hereinafter be described with reference to FIGS. 2A and 2B. FIG. 2A is a fragmentary plane view illustrative of the other conventional memory cell structure provided in the random access memory device. FIG. 2B is a fragmentary cross sectional elevation view illustrative of the other conventional memory cell structure provided in the random access memory device, taken along a C—C line in FIG.

The other conventional memory cell has a silicon on insulator structure. Field oxide films 2 are selectively formed on a surface of a p-type semiconductor substrate 1 to define a memory cell area surrounded by the field oxide films 2. An insulation film 10 is formed on the memory cell area of the p-type semiconductor substrate 1. A polysilicon film 11 is formed over the insulation film 10. A gate oxide film is formed over the polysilicon film 11. A gate electrode 3 is selectively formed over the gate oxide film. An ion implantation of n-type impurity into the polysilicon film 11 is carried out in a self-alignment technique using the gate electrode 3 as a mask to form n+-type source and drain regions 11S and 11D. As a result the polysilicon film 11 comprises the n+-type source and drain regions 11S and 11D and a channel region under the gate oxide film and between the n+-type source and drain regions 11S and 11D. An inter-layer insulator 5 is entirely formed over the n+-type source and drain regions 11S and 11D, the gate electrode 3 and the field oxide film 2. A capacitive contact hole 9 is formed in the inter-layer insulator 5 and positioned over the n+-type drain region 11D. A storage electrode 6 is selectively formed, which extends within the contact hole 9 and over the inter-layer insulator 5 around the contact hole 9 so that the storage electrode 6 is made into contact with the n+-type drain region 11D. A capacitive dielectric film 7 is selectively provided on a top surface and side walls of the storage electrode 6. A capacitive electrode 8 is entirely formed over the capacitive dielectric film 7 and over the inter-layer insulator 5. Contact holes 15 are formed over the field oxide films 2. Digit lines 14 are provided in parallel to each Other but in vertical to the word lines serving as the gate electrodes 3. The digit lines 14 are connected through the contact holes 15 to the n+-type source region 11S. The storage capacitor comprises the storage electrode 6, the capacitive dielectric film 7 and the capacitive electrode 8.

Digital signals are transmitted on the digit lines 14 which are connected to the n+-type source region 11S and the digit signals are then transmitted to the n+-type source region 11S. If the gate electrode 3 receives a high level signal, then the field effect transistor is in ON state. As a result, the digit signals are transmitted from the n+-type source region 11S through the channel region to the n+-type drain region 11D which is connected through the contact hole 9 to the storage electrode 6. The digit signals are then transmitted to the storage electrode 6 thereby the writing operation is completed. Thereafter, a low level signal is applied to the gate electrode 3 to turn the field effect transistor OFF to store information biased upon the digital signal in the capacitor. A storage time of storing the digital data is defined by the property of the storage capacitor. As described above, one of the causes of shortening the storage time of data is leakage of current from the drain region 11D to the p-type semiconductor substrate 1. In this silicon on insulation memory cell structure, the thin oxide film 10 isolates the drain region 11D from the p-type semiconductor substrate 1, for which reason the thin oxide film 10 prevents any leakage of current from the drain region 11D to the p-type semiconductor substrate 1. This prevention of leakage of current allows the memory cell capacitor to have an increased storage time of data.

Further, even if minority carriers are injected into the semiconductor substrate 1 by noise or radiation, the thin oxide film prevents neutralization of majority carriers stored in the drain region 11D by the minority carriers having opposite polarity to the stored majority carriers. Namely, the prevention of the neutralization of the majority carriers by the minority carriers results in prevention of breaking of data stored in the storage capacitor whereby any soft error can be prevented.

The above silicon on insulation memory cell structure is, however, engaged with the following problems. As described above, the source and drain regions 11S and 11D are formed in the polysilicon film 11, for which reason properties in sub-threshold region of the transistor is deteriorated. Namely, when the gate electrode 3 is in low level, a leakage of drain current may flow through the channel region under the gate electrode 3 to the source region. This leakage of drain current makes short the storage time of data. This leakage of drain current may be caused by many interface states. Namely, the polysilicon film has many grains which make deteriorated the interface between the polysilicon film and the oxide film as compared when a monocrystal silicon film is formed in place of the polysilicon film. The grains included in the polysilicon have variety in size due to a large influence by a growth temperature for growing the polysilicon film. The variety in size of the grains included in the polysilicon film causes a considerable variation in property of the transistor. Whereas it was proposed to carry out a crystallization of the polysilicon by laser annealing after the polysilicon film was grown, a satisfactory result can not be obtained.

Furthermore, in the memory cell as illustrated in FIGS. 1A and 1B, the semiconductor substrate is biased so that the potential of the semiconductor substrate becomes negative to improve the sub-threshold property and suppress leakage of currents. In the memory cell as illustrated in FIGS. 2A and 2B, the semiconductor substrate is, however, isolated by the oxide film from the drain region of the polysilicon film, for which reason it is impossible to apply a bias to the substrate and improve the sub-threshold property.

Assuming that a capacity of the storage capacitor is 25 fF and data are written at a voltage of 3 V and further error appears when storage carriers are reduced to a half, in order to ensure the storage time of 10 seconds, a maximum leakage of current Icr is given as follows.

$$Icr = (3 \times 25/2)/10 = 3.8 \, fA$$

In the above circumstances, it had been required to develop a MOS field effect transistor in a memory cell structure for a dynamic random access memory device, wherein the MOS field effect transistor has a structure suitable for reducing leakage of current and possessing a long storage time of data as well as preventing soft error.

SUMMARY OF THE INVENTION

Accordingly, it is an object of the present invention to provide an improved MOS field effect transistor included in a memory cell in a dynamic random access memory device, wherein the MOS field effect transistor has a structure enabling suppression of the problems as described above.

It is a further object of the present invention to provide an improved MOS field effect transistor included in a memory cell in a dynamic random access memory device, wherein the MOS field effect transistor has a structure suitable for reducing leakage of current.

It is a further more object of the present invention to provide an improved MOS field effect transistor included in a memory cell in a dynamic random access memory device, wherein the MOS field effect transistor has a structure suitable for enabling a long storage time of data.

It is moreover object of the present invention to provide an improved MOS field effect transistor included in a memory cell in a dynamic random access memory device, wherein the MOS field effect transistor has a structure suitable for preventing soft error.

It is a still further object of the present invention to provide an improved memory cell in a dynamic random access memory device, which has a structure enabling suppression of the problems as described above.

It is yet a further object of the present invention to provide an improved memory cell in a dynamic random access memory device, which has a structure suitable for reducing leakage of current.

It is still more object of the present invention to provide an improved memory cell in a dynamic random access memory device, which has a structure suitable for enabling a long storage time of data.

It is yet more object of the present invention to provide an improved memory cell in a dynamic random access memory device, which has a structure suitable for preventing soft error.

It is another object of the present invention to provide a novel method for fabricating an improved MOS field effect transistor included in a memory cell in a dynamic random access memory device, wherein the MOS field effect transistor has a structure enabling suppression of the problems as described above.

It is still another object of the present invention to provide a novel method for fabricating an improved MOS field effect transistor included in a memory cell in a dynamic random access memory device, wherein the MOS field effect transistor has a structure suitable for reducing leakage of current.

It is yet another object of the present invention to provide a novel method for fabricating an improved MOS field effect transistor included in a memory cell in a dynamic random access memory device, wherein the MOS field effect transistor has a structure suitable for enabling a long storage time of data.

It is further another object of the present invention to provide a novel method for fabricating an improved MOS field effect transistor included in a memory cell in a dynamic random access memory device, wherein the MOS field effect transistor has a structure suitable for preventing soft error.

It is an additional object of the present invention to provide a novel method for fabricating an improved memory cell in a dynamic random access memory device, which has a structure enabling suppression of the problems as described above.

It is a further additional object of the present invention to provide a novel method for fabricating an improved memory cell in a dynamic random access memory device, which has a structure suitable for reducing leakage of current.

It is still more additional object of the present invention to provide a novel method for fabricating an improved memory cell in a dynamic random access memory device, which has a structure suitable for enabling a long storage time of data.

It is yet more additional object of the present invention to provide a novel method for fabricating an improved memory cell in a dynamic random access memory device, which has a structure suitable for preventing soft error.

The above and other objects, features and advantages of the present invention will be apparent from the followings descriptions.

The present invention provides a field effect transistor comprising the following elements. An insulation film is provided on a semiconductor substrate. The insulation film has an opening positioned on a predetermined region of the semiconductor substrate. A first polysilicon film is provided over the insulation film. A second polysilicon film is provided in contact with the first polysilicon film. The second polysilicon film extends on inside walls of the opening of fie insulation film and over a peripheral portion of the predetermined region of the semiconductor substrate so that the first polysilicon film is connected through the second polysilicon film to the peripheral portion in the predetermined region of the semiconductor substrate. A gate insulation film is selectively provided, which extends on the predetermined region, except on the peripheral portion, of the semiconductor substrate and further extends on the second polysilicon film and a part of the first polysilicon film around the second polysilicon film. A gate electrode is provided on the gate insulation film to define a composite channel region under the gate insulation film so that the composite channel region extends through the first and second polysilicon films under the gate insulation film as well as through the semiconductor substrate under the gate insulation film. Source and drain regions are selectively provided in the first polysilicon film except under the gate insulation film so that the source and drain regions are connected through the composite channel region.

The present invention also provides a memory cell structure comprising the following elements. A field oxide film is selectively formed on the semiconductor substrate to define a memory cell area of the semiconductor substrate. An insulation film is provided on the memory cell area of the semiconductor substrate, wherein the insulation film has an opening positioned on a predetermined region in the memory cell area of the semiconductor substrate. A first polysilicon film is provided over the insulation film. A second polysilicon film is provided in contact with the first polysilicon film and extending on inside walls of the opening of the insulation film and over a peripheral portion of the predetermined region of the semiconductor substrate so that the first polysilicon film is connected through the second polysilicon film to the peripheral portion in the predetermined region of the semiconductor substrate. A gate insulation film is selectively provided, which extends on the predetermined region, except on the peripheral portion, of the semiconductor substrate and further extends on the second polysilicon film and a part of the first polysilicon film around the second polysilicon film. A gate electrode is provided on the gate insulation film to define a composite channel region under the gate insulation film so that the composite channel region extends through the first and second polysilicon films under the gate insulation film as well as through the semiconductor substrate under the gate insulation film. Source and drain regions are selectively provided in the first polysilicon film except under the gate insulation film so that the source and drain regions are connected through the composite channel region. An inter-layer insulator is provided over the field oxide film, the source and drain regions and the gate electrode, wherein the inter-layer insulator has a contact hole positioned over the drain region. A storage electrode is selectively provided, which extends over the inter-layer insulator around the contact hole and extends within the contact hole so that the storage electrode is made into contact with the drain region. A capacitive dielectric film extends over the storage electrode and on side walls of the storage electrode. A capacitive electrode is provided at least on an entire region of the capacitive dielectric film.

The present invention also provides a method for fabricating a field effect transistor comprising the following steps. An insulation film is formed on a semiconductor substrate. A first polysilicon film is formed over the insulation film. An opening is formed in the insulation film and the first polysilicon film so that a predetermined region of the semiconductor substrate is exposed to the opening. A second polysilicon film is selectively formed, which is in contact with the first polysilicon film and extends on inside walls of the opening of the insulation film and as well as extending over a peripheral portion of the predetermined region of the semiconductor substrate so that the first polysilicon film is connected through the second polysilicon film to the peripheral portion in the predetermined region of the semiconductor substrate. A gate insulation film is selectively formed, which extends on the predetermined region, except on the peripheral portion, of the semiconductor substrate and further extends on the second polysilicon film and a part of the first polysilicon film around the second polysilicon film. A gate electrode is formed on the gate insulation film to define a composite channel region under the gate insulation film so that the composite channel region extends through the first and second polysilicon films under the gate insulation film as well as through the semiconductor substrate under the gate insulation film. Source and drain regions are selectively formed in the first polysilicon film except under the gate insulation film so that the source and drain regions are connected through the composite channel region.

The present invention also provides a method for fabricating a memory cell comprising the following steps. A field oxide film and an oxide film are selectively formed on the semiconductor substrate to define a memory cell area of the semiconductor substrate. A first polysilicon film is formed over the insulation film. An opening is formed in the insulation film and the first polysilicon film so that a predetermined region of the semiconductor substrate is exposed to the opening. A second polysilicon film is selectively formed being in contact with the first polysilicon film and extending on inside walls of the opening of the insulation film and as well as extending over a peripheral portion of the predetermined region of the semiconductor substrate so that the first polysilicon film is connected through the second polysilicon film to the perpheral portion in the predetermined region of the semiconductor substrate. A gate insulation film is selectively formed, which extends on the predetermined region, except on the peripheral portion, of the semiconductor substrate and further extending on the second polysilicon film and a part of the first polysilicon film around the second polysilicon film. A gate electrode is formed on the gate insulation film to define a composite channel region under the gate insulation film so that the composite channel region extends through the first and second polysilicon films under the gate insulation film as well as through the semiconductor substrate under the gate insulation film. Source and drain regions are selectively formed in the first polysilicon film except under the gate insulation film so that the source and drain regions are connected through the composite channel region. An inter-layer insulator is formed over the field oxide film, the source and drain regions and the gate electrode. A contact hole is formed in the inter-layer insulator so that the contact hole is positioned over the drain region. A storage electrode is selectively formed, which extends over the inter-layer insulator around the contact hole and extending within the contact hole so that the storage electrode is made into contact with the drain region. A capacitive dielectric film is formed which extends over the storage electrode and on side walls of the storage electrode. A capacitive electrode is formed at least on an entire region of the capacitive dielectric film.

BRIEF DESCRIPTIONS OF THE DRAWINGS

Preferred embodiments according to the present invention will be described in detail with reference to the accompanying drawings.

PREFERRED EMBODIMENTS

Figure 1A:
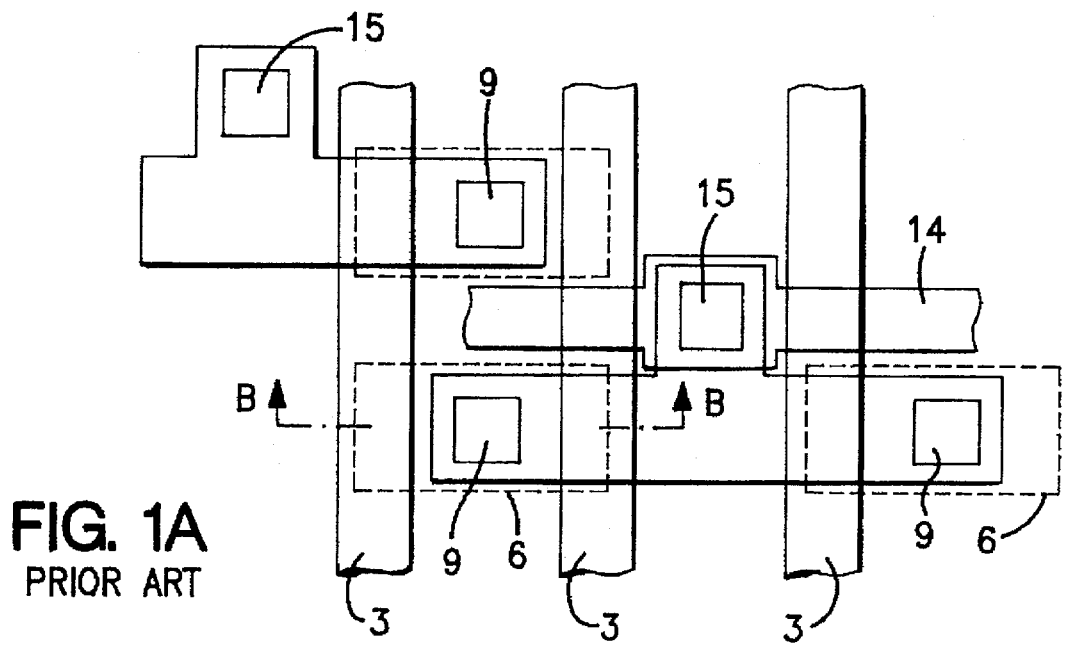
FIG. 1A is a fragmentary plane view illustrative of the conventional dynamic random access memory device.
Figure 1B:
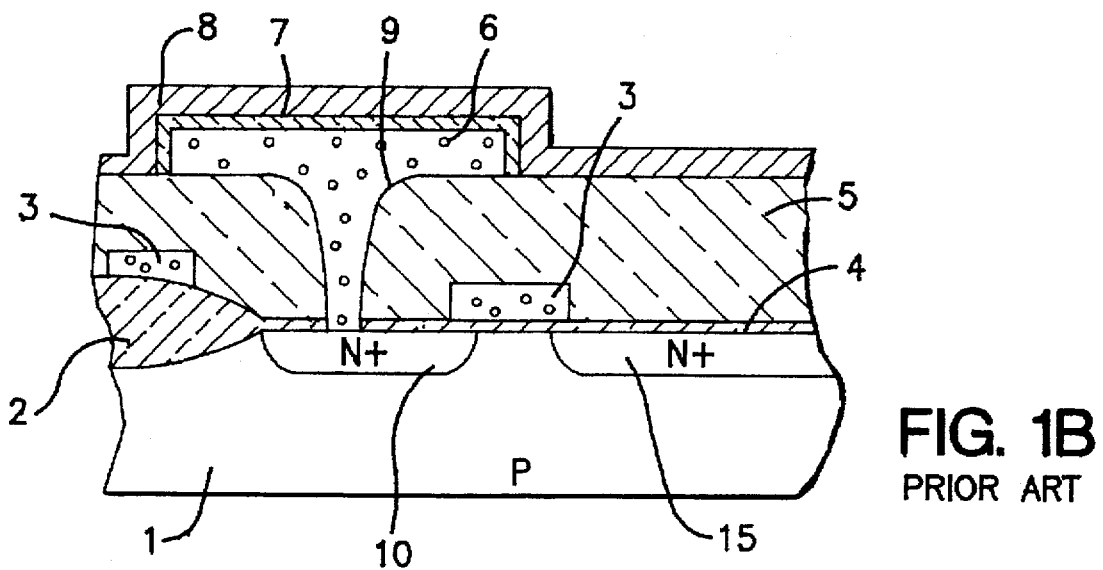
FIG. 1B is a fragmentary cross sectional elevation view illustrative of the conventional dynamic random access memory device, taken along a B—B line in FIG. 1A.
Figure 2A:
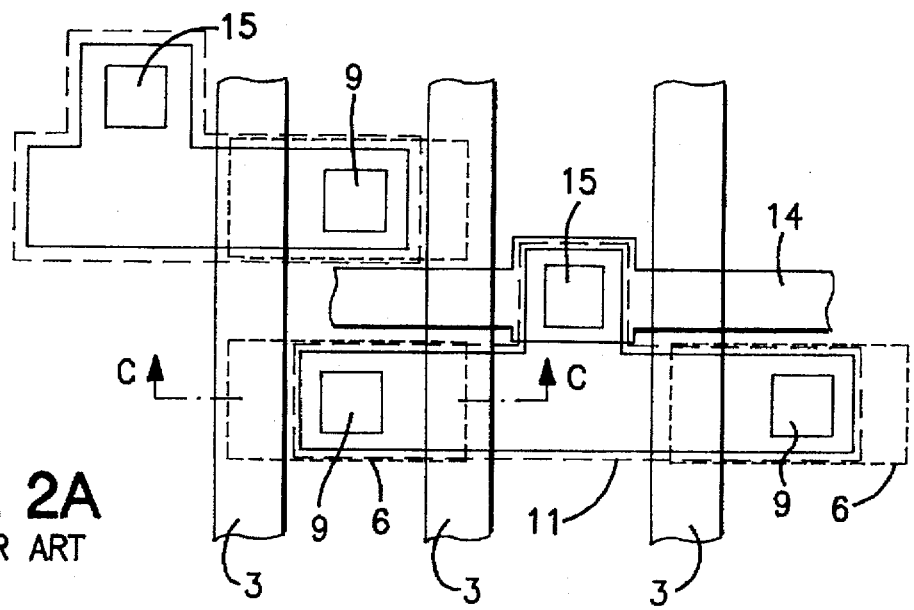
FIG. 2A is a fragmentary plane view illustrative of the other conventional memory cell structure provided in the random access memory device.
Figure 2B:
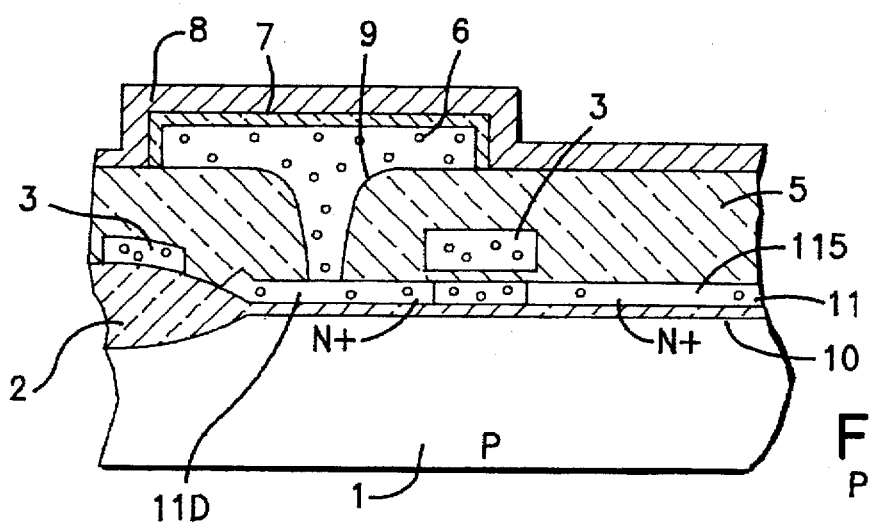
FIG. 2B is a fragmentary cross sectional elevation view illustrative of the other conventional memory cell structure provided in the random access memory device, taken along a C—C line in FIG. 2A.
Figure 3A:
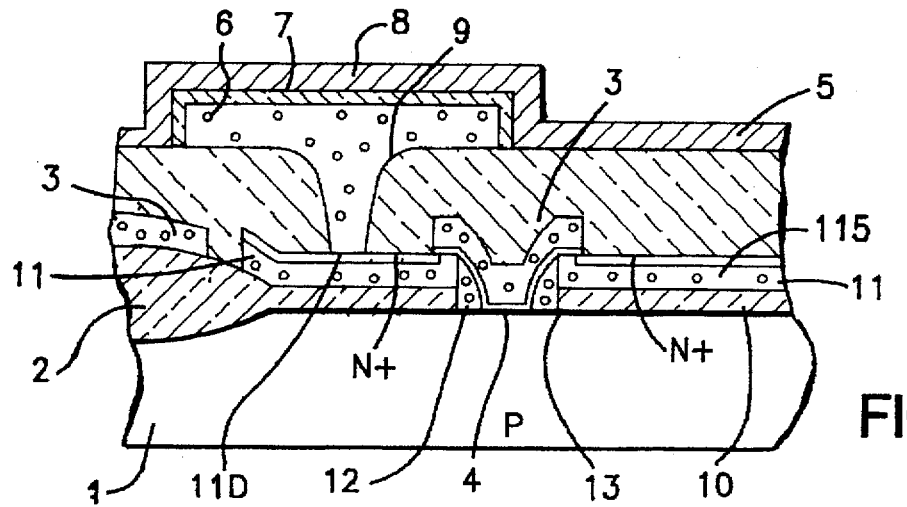
FIG. 3A is a fragmentary cross sectional elevation view illustrative of an improved dynamic random access memory device in a preferred embodiment according to the present invention.
Figure 3B:
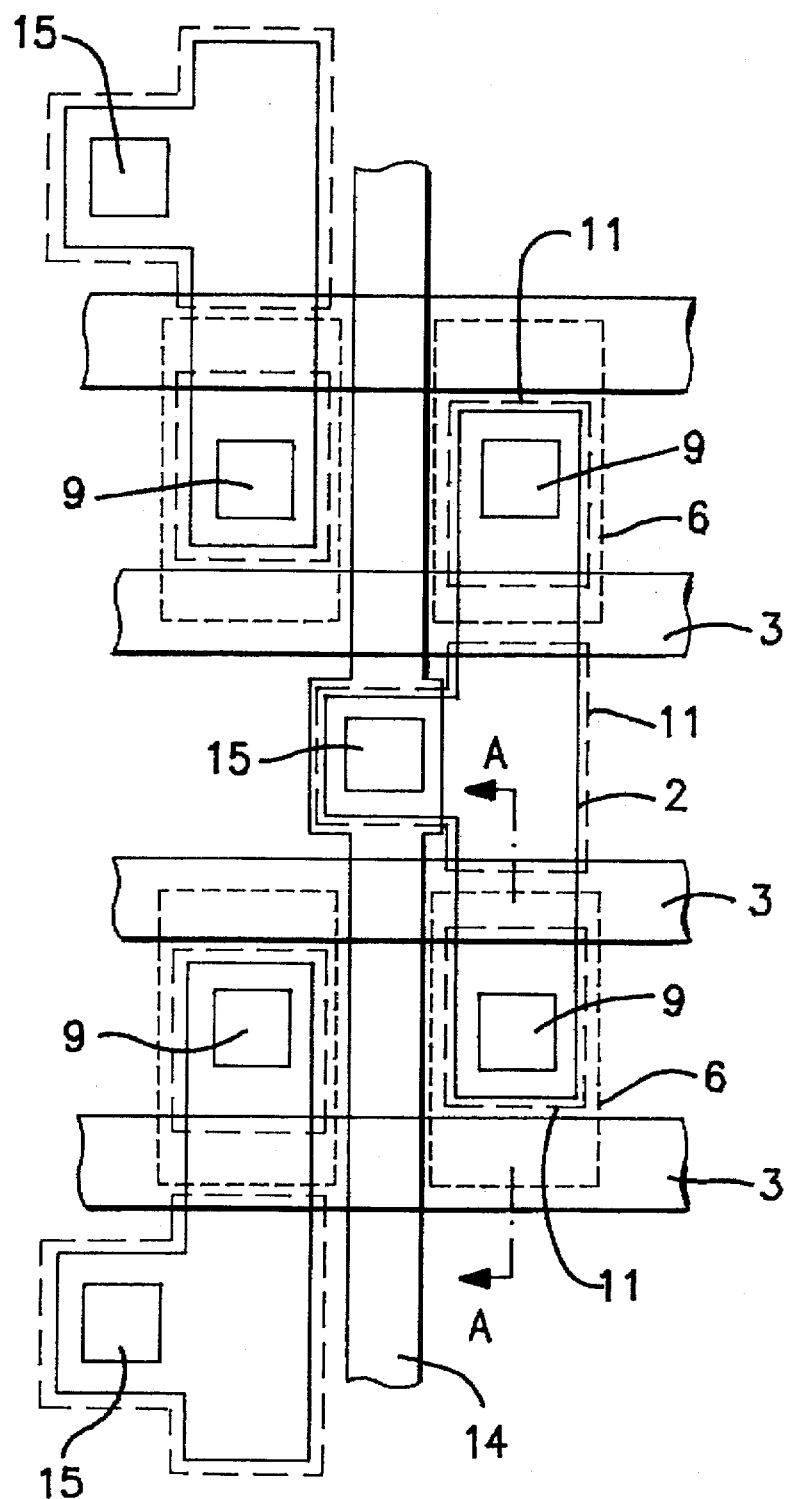
FIG. 3B is a fragmentary plane view illustrative of the conventional dynamic random access memory device in a preferred embodiment according to the present invention.
Figure 4A:
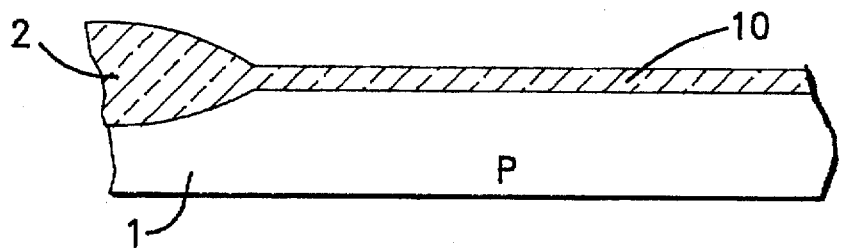
FIGS. 4A through 4H are fragmentary cross sectional elevation views illustrative of improved dynamic random access memory devices involved in a method for fabricating the improved dynamic random access memory device in a preferred embodiment according to the present invention.
Figure 4B:
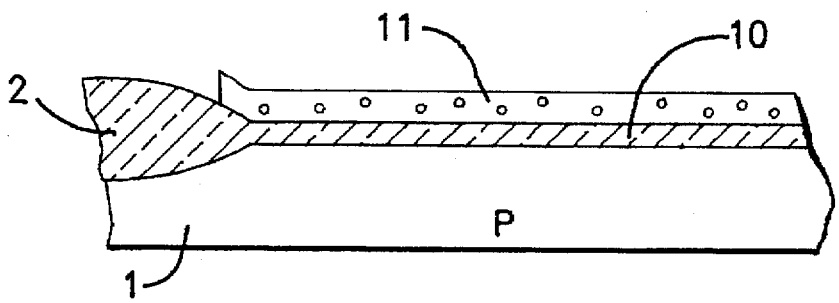
Figure 4C:
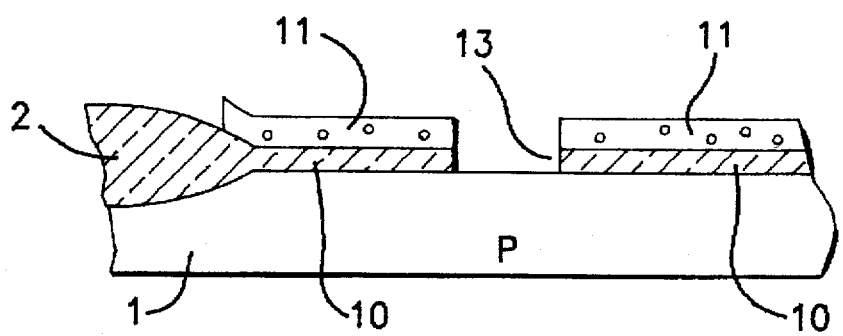
Figure 4D:
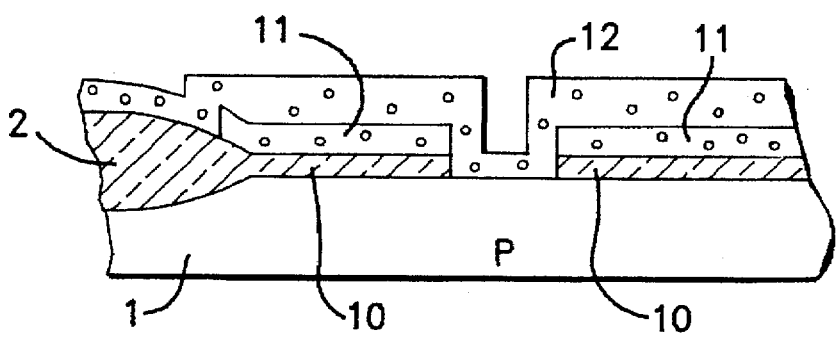
Figure 4E:
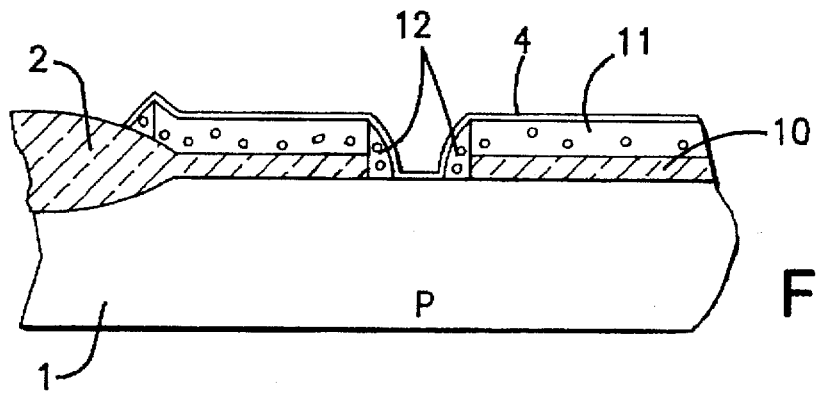
Figure 4F:
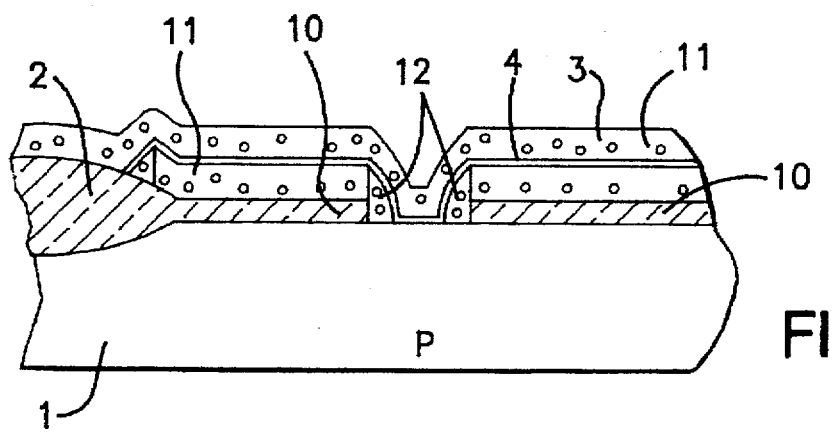
Figure 4G:
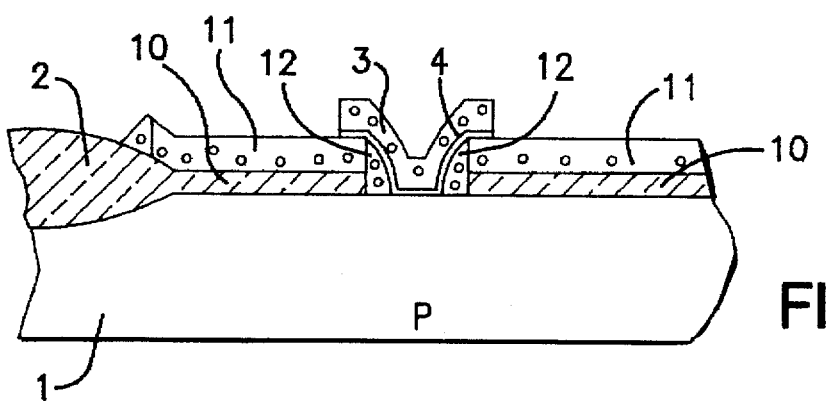
Figure 4H:
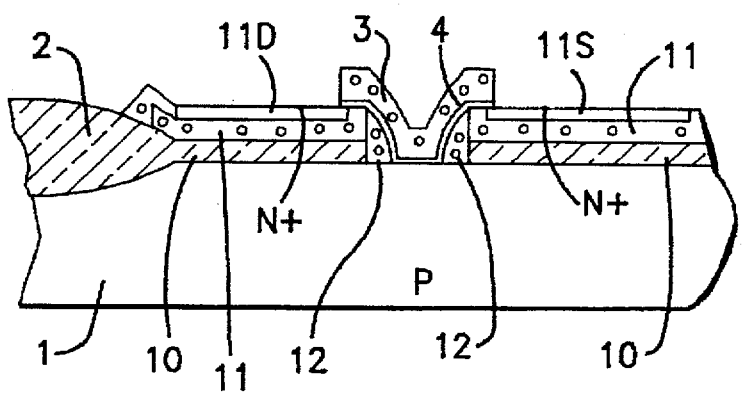

A preferred embodiment according to the present invention will be described in detail with reference to FIGS. 3A and 3B and FIGS. 4A through 4H. A memory cell is formed on a p-type semiconductor substrate 1. Field oxide films 2 are selectively formed on the p-type semiconductor substrate 1 to define a memory cell area of the p-type semiconductor substrate 1. An insulation film 10 is provided over the memory cell area of the p-type semiconductor substrate 1. An opening is formed in the insulation film 10 on a predetermined area in the memory cell area of the p-type semiconductor substrate 1. A first polysilicon film 11 is provided over the insulation film 10 except over the opening. A second insulation film 12 is selectively provided over a peripheral portion of the predetermined area of the p-type semiconductor substrate 1, wherein the second insulation film 12 is in contact with side walls of the insulation film 10 and the first polysilicon film 11. A gate insulation film 4 is selectively provided, which extends on the predetermined region, except on its peripheral portion, of the semiconductor substrate 1 and further extends on the second polysilicon film 12 and a part of the first polysilicon film 11 around the second polysilicon film 12. A gate electrode 3 is provided on the gate insulation film 4 to define a composite channel region under the gate insulation film 4 so that the composite channel region extends through the first and second polysilicon films 11 and 12 under the gate insulation film 4 as well as through the semiconductor substrate 1 under the gate insulation film 4. Source and drain regions 11S and 11D are selectively provided in the first polysilicon film 11 except under the gate insulation film 4 so that the source and drain regions 11S and 11D are connected through the composite channel region. An inter-layer insulator 5 is provided over the field oxide film 2, the source and drain regions 11S and 11D and the gate electrode 3, wherein the inter-layer insulator 5 has a contact hole 9 positioned over the drain region 11D. A storage electrode 6 is selectively provided, which extends over the inter-layer insulator 5 around the contact hole 9 and extends within the contact hole 9 so that the storage electrode 6 is made into contact with the drain region 11D. A capacitive dielectric film 7 extends over the storage electrode 6 and on side walls of the storage electrode 6. A capacitive electrode 8 is provided on an entire region of the capacitive dielectric film 7 and over the inter-layer insulator 5. Contact holes 15 are formed over the field oxide films 2. Digit lines 14 are provided in parallel to each other but in vertical to the word lines serving as the gate electrodes 3. The digit lines 14 are connected through the contact holes 15 to the n+-type source region 11S. The storage capacitor comprises the storage electrode 6, the capacitive dielectric film 7 and the capacitive electrode 8.

The first polysilicon film 11 is connected through the second polysilicon film 12 to the p-type semiconductor substrate 1, and the channel region of the field effect transistor extends through the first and second polysilicon films 11 and 12 under the gate insulation film 4 as well as through the semiconductor substrate 1 under the gate insulation film 4. This means that the above field effect transistor It is another object of the present invention to provide a novel method for fabricating an improved MOS field effect transistor included in a memory cell in a dynamic random access memory device, wherein the MOS field effect transistor has a structure enabling suppression of the problems as described above.

It is still another object of the present invention to provide a novel method for fabricating an improved MOS field effect transistor included in a memory cell in a dynamic random access memory device, wherein the MOS field effect transistor has a structure suitable for reducing leakage of current.

It is yet another object of the present invention to provide a novel method for fabricating an improved MOS field effect transistor included in a memory cell in a dynamic random access memory device, wherein the MOS field effect transistor has a structure suitable for enabling a long storage time of data.

It is further another object of the present invention to provide a novel method for fabricating an improved MOS field effect transistor included in a memory cell in a dynamic random access memory device, wherein the MOS field effect transistor has a structure suitable for preventing soft error.

It is an additional object of the present invention to provide a novel method for fabricating an improved memory cell in a dynamic random access memory device, which has a structure enabling suppression of the problems as described above.

It is a further additional object of the present invention to provide a novel method for fabricating an improved memory cell in a dynamic random access memory device, which has a structure suitable for reducing leakage of current.

It is still more additional object of the present invention to provide a novel method for fabricating an improved memory cell in a dynamic random access memory device, which has a structure suitable for enabling a long storage time of data.

It is yet more additional object of the present invention to provide a novel method for fabricating an improved memory cell in a dynamic random access memory device, which has a structure suitable for preventing soft error.

The above and other objects, features and advantages of the present invention will be apparent from the followings descriptions.

The present invention provides a field effect transistor comprising the following elements. An insulation film is provided on a semiconductor substrate. The insulation film has an opening positioned on a predetermined region of the semiconductor substrate. A first polysilicon film is provided over the insulation film. A second polysilicon film is provided in contact with the first polysilicon film. The second polysilicon film extends on inside walls of the opening of fie insulation film and over a peripheral portion of the predetermined region of the semiconductor substrate so that the first polysilicon film is connected through the second polysilicon film to the peripheral portion in the predetermined region of the semiconductor substrate. A gate insulation film is selectively provided, which extends on the predetermined region, except on the peripheral portion, of the semiconductor substrate and further extends on the second polysilicon film and a part of the first polysilicon film around the second polysilicon film. A gate electrode is provided on the gate insulation film to define a composite channel region under the gate insulation film so that the composite channel region extends through the first and second polysilicon films under the gate insulation film as well as through the semiconductor substrate under the gate insulation film. Source and drain regions are selectively provided in the first polysilicon film except under the gate insulation film so that the source and drain regions are connected through the composite channel region.

The present invention also provides a memory cell structure comprising the following elements. A field oxide film is selectively formed on the semiconductor substrate to define a memory cell area of the semiconductor substrate. An insulation film is provided on the memory cell area of the semiconductor substrate, wherein the insulation film has an opening positioned on a predetermined region in the memory cell area of the semiconductor substrate. A first polysilicon film is provided over the insulation film. A second polysilicon film is provided in contact with the first polysilicon film and extending on inside walls of the opening of the insulation film and over a peripheral portion of the predetermined region of the semiconductor substrate so that the first polysilicon film is connected through the second polysilicon film to the peripheral portion in the predetermined region of the semiconductor substrate. A gate insulation film is selectively provided, which extends on the predetermined region, except on the peripheral portion, of the semiconductor substrate and further extends on the second polysilicon film and a part of the first polysilicon film around the second polysilicon film. A gate electrode is provided on the gate insulation film to define a composite channel region under the gate insulation film so that the composite channel region extends through the first and second polysilicon films under the gate insulation film as well as through the semiconductor substrate under the gate insulation film. Source and drain regions are selectively provided in the first polysilicon film except under the gate insulation film so that the source and drain regions are connected through the composite channel region. An inter-layer insulator is provided over the field oxide film, the source and drain regions and the gate electrode, wherein the inter-layer insulator has a contact hole positioned over the drain region. A storage electrode is selectively provided, which extends over the inter-layer insulator around the contact hole and extends within the contact hole so that the storage electrode is made into contact with the drain region. A capacitive dielectric film extends over the storage electrode and on side walls of the storage electrode. A capacitive electrode is provided at least on an entire region of the capacitive dielectric film.

The present invention also provides a method for fabricating a field effect transistor comprising the following steps. An insulation film is formed on a semiconductor substrate. A first polysilicon film is formed over the insulation film. An opening is formed in the insulation film and the first polysilicon film so that a predetermined region of the semiconductor substrate is exposed to the opening. A second polysilicon film is selectively formed, which is in contact with the first polysilicon film and extends on inside walls of the opening of the insulation film and as well as extending over a peripheral portion of the predetermined region of the semiconductor substrate so that the first polysilicon film is connected through the second polysilicon film to the peripheral portion in the predetermined region of the semiconductor substrate. A gate insulation film is selectively formed, which extends on the predetermined region, except on the peripheral portion, of the semiconductor substrate and further extends on the second polysilicon film and a part of the first polysilicon film around the second polysilicon film. A gate electrode is formed on the gate insulation film to define a composite channel region under the gate insulation film so that the composite channel region extends through the first and second polysilicon films under the gate insulation film predetermined region of said semiconductor substrate so that said first polysilicon film is connected through said second polysilicon film to said peripheral portion in said predetermined region of said semiconductor substrate;

a gate insulation film selectively provided, which extends on said predetermined region, except on said peripheral portion, of said semiconductor substrate and further extends on said second polysilicon film and a part of said first polysilicon film around said second polysilicon film;

a gate electrode provided on said gate insulation film to define a composite channel region under said gate insulation film so that said composite channel region extends through said first and second polysilicon films under said gate insulation film as well as through said semiconductor substrate under said gate insulation film; and source and drain regions selectively provided in said first polysilicon film except under said gate insulation film so that said source and drain regions are connected through said composite channel region.

2. A memory cell structure comprising:

a semiconductor substrate;

a field oxide film selectively formed on said semiconductor substrate to define a memory cell area of said semiconductor substrate;

an insulation film provided on said memory cell area of said semiconductor substrate, said insulation film having an opening positioned on a predetermined region in said memory cell area of said semiconductor substrate;

a first polysilicon film provided over said insulation film;

a second polysilicon film provided in contact with said first polysilicon film, said second polysilicon film extending on inside walls of said opening of said insulation film and over a peripheral portion of said predetermined region of said semiconductor substrate so that said first polysilicon film is connected through said second polysilicon film to said peripheral portion in said predetermined region of said semiconductor substrate;

a gate insulation film selectively provided, which extends on said predetermined region, except on said peripheral portion, of said semiconductor substrate and further extends on said second polysilicon film and a part of said first polysilicon film around said second polysilicon film;

a gate electrode provided on said gate insulation film to define a composite channel region under said gate insulation film so that said composite channel region extends through said first and second polysilicon films under said gate insulation film as well as through said semiconductor substrate under said gate insulation film;

source and drain regions selectively provided in said first polysilicon film except under said gate insulation film so that said source and drain regions are connected through said composite channel region;

an inter-layer insulator provided over said field oxide film, said source and drain regions and said gate electrode, said inter-layer insulator having a contact hole positioned over said drain region;

a storage electrode selectively provided, which extends over said inter-layer insulator around said contact hole and extends within said contact hole so that said storage electrode is made into contact with said drain region;

a capacitive dielectric film extending over said storage electrode and on side walls of said storage electrode; and a capacitive electrode provided at least on an entire region of said capacitive dielectric film.

\* \* \* \* \*